United States Patent [19]

Fudim

[11] Patent Number: 4,801,477
[45] Date of Patent: Jan. 31, 1989

[54] METHOD AND APPARATUS FOR PRODUCTION OF THREE-DIMENSIONAL OBJECTS BY PHOTOSOLIDIFICATION

[76] Inventor: Efrem V. Fudim, 4815 N. Marlborough Dr., Milwaukee, Wis. 53217

[21] Appl. No.: 102,118

[22] Filed: Sep. 29, 1987

[51] Int. Cl.$^4$ ......................... B05D 3/06; B29C 35/08; B29B 13/08
[52] U.S. Cl. .................... 427/54.1; 425/174; 430/321; 264/22
[58] Field of Search ................ 427/54.1; 264/1.4, 1.5, 264/1.7, 2.3, 2.4, 22; 425/174, 174.4, 174.6; 430/321; 425/67, 69

[56] References Cited

U.S. PATENT DOCUMENTS

| 4,137,081 | 1/1979 | Pohl | 430/306 |
|---|---|---|---|
| 4,174,218 | 11/1979 | Pohl | 430/309 |
| 4,228,232 | 10/1980 | Rousseau | 430/271 |
| 4,376,160 | 3/1983 | Evanchuk | 430/321 |
| 4,575,330 | 3/1986 | Hull | 264/22 |

FOREIGN PATENT DOCUMENTS

| 0260125 | 6/1984 | Japan | 427/53.1 |
|---|---|---|---|
| 626967 | 3/1977 | U.S.S.R. | 264/1.7 |
| 626968 | 3/1977 | U.S.S.R. | 264/1.7 |

OTHER PUBLICATIONS

Efrem Fudim, "A New Method of 3-D Micromachining", *Mechanical Engineering*, Sep. 1985, pp. 54–59.
Efrem Fudim, "Sculpting with Light", *Machine Design*, Mar. 6, 1986, pp. 102–106.

*Primary Examiner*—Norman Morgenstern
*Assistant Examiner*—Marianne L. Podgett

[57] ABSTRACT

An improved method of forming three-dimensional objects comprises irradiating an uncured photopolymer by emitting an effective amount of photopolymer solidifying radiation directly into a desired area inside of uncured photopolymer using an immersed radiation guide. The radiation is emitted through a material which leaves the irradiated surface capable of further cross-linking so that when an adjacent area is irradiated, it will adhere thereto. Repeating the irradiation for all areas in desired sequence, any three-dimensional object can be made; depending on the size of the emitted beam and the amount of emitted energy, objects can be formed point by point, post by post, area by area or layer by layer.

18 Claims, 1 Drawing Sheet 4,801,477

METHOD AND APPARATUS FOR PRODUCTION OF THREE-DIMENSIONAL OBJECTS BY PHOTOSOLIDIFICATION

RELATED DISCLOSURE DOCUMENT

A disclosure document No. 168251 describing the invention was filed with the U.S. Patent Office on Apr. 13, 1987.

FIELD OF THE INVENTION

This invention relates to improvements in a method and apparatus for production of three-dimensional objects. More specifically, it relates to a method and apparatus for forming three-demensional objects by the irradiation of photopolymers that solidify in response to radiation.

BACKGROUND OF THE INVENTION

All of the commonly practiced processes for fabricating three-dimensional objects have disadvantages. For example, the mechanical removal of material to form such objects involves much energy, time and processing; the chemical machining to form such objects has depth limitations and the incapability of making complex shapes; and the thermal molding requires expensive molds, is very inflexible and takes much time and energy.

Several methods and apparatus have been developed for the production of three-dimensional objects by irradiation of photopolymers that cross-link and solidify upon irradiation.

Forming three-dimensional objects by solidifying each point individually can be accomplished by scanning the whole volume of the object point by point with two intersecting beams, as described, for example, in U.S. Pat. Nos. 4,041,476 and 4,288,861. However, such methods are very complex and expensive. The forming of three-dimensional objects by buildingup succesive very thin laminae of the solidified photopolymer is described in U.S. Pat. No. 4,575,330. The method involves many production steps due to the large number of laminae required, especially for objects with inclined or curved walls. Since an open surface is irradiated, there is shrinkage and resulting distortion. There also are limitations on feasible geometries. In my U.S. patent application Ser. No. 20,764 filed on Mar. 2, 1987 now U.S. Pat. No. 4,752,498 is described fabrication by building up succesive layers. Each layer is formed by irradiation through a rigid radiation transmittent material which is in contact with the uncured photopolymer to minimize shrinkage distortion, and which leaves the irradiated surface capable of further cross-linking so that a subsequently formed layer adheres thereto. The amount of irradiation is modulated across the irradiated surface to vary depth of solidification. This method also features geometrical limitations due to the forming by whole layers.

Three-dimensional objects of various geometries are widely used everywhere in final products, prototypes and models. A large number of such objects could be made of photopolymers by photosolidification if there were a suitable apparatus and method of producing these objects which resulted in dramatic reductions in cost and time and improvements in accuracy and performance.

SUMMARY OF THE INVENTION

The primary objects of the present invention are to provide an improved apparatus and method for making three-dimensional objects by the photosolidification of photopolymers.

The preferred method of the present invention for generating three-dimensional objects from a photopolymer capable of solidification in response to radiation comprizes providing a quantity of uncured photopolymer in a container. A radiation guide having a radiation emitting surface which does not prevent the further cross-linking of the polymer and which can be removed from the solidified polymer is immersed to a desired area of the photopolymer. Next, an effective amount of photopolymer solidifying radiation is transmitted through the radiation emitting surface into the uncured photopolymer, causing the photopolymer in contact with the radiation emitting surface to solidify. By repositioning the radiation emitting surface and repeating the irradiation, complex three-dimensional objects can be formed. Objects can be created point by point when the radiation emitting surface is small and the amount of radiation is sufficient to solidify to a small depth, post by post when the amount of radiation is larger, or area by area and layer by layer when the radiation emitting surface is of respective size.

The simplest form of the novel apparatus of the present invention includes a container for the uncured photopolymer; an immersed optical fiber (or bundle of them) having a radiation emitting surface that does not interfere with the further cross-linking of the irradiated polymer and can be removed from it; a source of photopolymer solidifying radiation, and means for repositioning the optical fiber.

In another embodiment of the apparatus, means of modulating radiation are added so that desired shaped areas of larger sizes are solidified during each irradiation step.

In still another embodiment no optical fibers are used and radiation source is mounted adjacent to the radiation emitting surface inside the radiation guide immersed in the photopolymer.

DESCRIPTION OF THE PREFERRED EMBODIMENT

The invention will now be described in connection with the drawings.

Figures 1, 2:
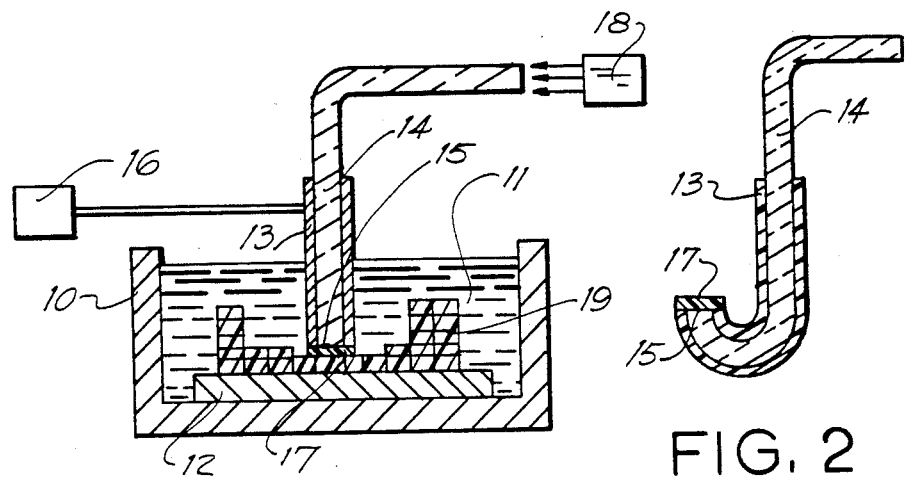
FIG. 1 is a view, partly in section, of a preferred embodiment of the apparatus of the invention.
FIG. 2 is a similar view of radiation guide emitting radiation upwards.

As seen in FIG. 1, a container 10 is partially filled with an uncured photopolymer 11 that solidifies when irradiated, preferrably with ultraviolet (UV) or similar radiation. Secured in the container 10 is a substrate 12. A guide 13 housing an optical fiber 14 (or bundle of them) is immersed in the liquid photopolymer 11. Guide 13 is made of material that does not transmit the radiation and has an opening at the bottom providing a radiation emitting surface 15. Guide 13 is supported and positioned by drive 16. The radiatioin emitting surface 15 is covered with a preferrably rigid radiation transmitting layer 17 which does not substantially interfere with the ability of the photopolymer to further crosslink and which can be removed from solidified polymer. Positioned at the other end of the optical fiber 14 is a source of photopolymer solidifying radiation 18.

When it is desired to make a desired three-dimensional object 19 with the described apparatus, layer 17 is positioned at a small distance from substrate 12, radiation from the light source 18 is transmitted through the optical fiber 14 and layer 17 into the uncured photopolymer 11 to solidify the photopolymer between layer 17 and substrate 12 and attach it to substrate 12. Guide 13 is then slid off, repositioned over the area on substrate 12 to be solidified next, and radiation reapplied. The procedure is repeated until the desired three-dimensional object is formed. Points can be solidified in different sequences; for some objects it can be done by layers.

When the irradiation is complete, the guide 13 with its layer 17 are slid off the solidified object 19, and the solidified object 19, preferably with the substrate 12 upon which it rests, are taken out of container 10. Excess unsolidified polymer 11 is removed using alcohol or other suitable solvent. The object 19 is dried, for example, by using warm air jets, and subjected to additional irradiation, if necessary, to complete the cross-linking. The object 19 can be removed from the substrate 12 either before or after removing unsolidified photopolymer.

Any liquid polymer that is uncured and can be solidified with radiation can be used in this process. Usually, light sensitive additives are used to reduce required energy. Common additives are benzophenone derivatives, quinones, benzol, benzoin ethers, and halogenated compounds. A preferred photopolymer liquid for use in the present invention is Magnacryl 2296 made by Beacon Chemical Company of Mount Vernon, N.Y.. Suitable polymers are disclosed in U.S. Pat. Nos. 4,228,232; 4,174,218; and 4,137,081 which are incorpoporated by reference herein. It is not necessary to provide all the required quantity of polymer before irradiation; it can be added periodically or continuously so that radiation transmitting layer 18 is immersed in polymer at all times.

The transparent layer 17 can be any material which leaves the irradiated surface of the photopolymer capable of further cross-linking and which can be removed from solidified photopolymer without distorting the latter. The preferred material is fluorinated ethylene propylene which is available as Teflon FEP from E.I. du Pont of Wilmington, De. Another resin that can be used is UHMW polyolefin available from CHR Indurstries of New Haven, CT. Materials that inhibit photopolymer cross-linking like those containing copper or oxygen in their molecules can also be employed.

A suitable radiation source is an assembly or a single General Electric lamp emitting UV light in the range of about 200 to about 500 nm, and preferrably about 300 to about 400 nm, and providing intensity of several mw/sq.cm at the irradiated surface of the photopolymer. Some photopolymers may require different wavelengths and/or radiation intensities. Lasers, mercury lamps, or other radiation sources also can be used. For high accuracy and resolution, the radiation should be collimated. Radiation source 18 can be mounted on top or inside of guide 13. Suitable optical fiber 14 is fiber optic guide type Z from Applied Fiberoptics of Southbridge, MA.

The substrate 12 can be of glass, plastic, stainless steel or any other material which will serve as a suitable support to which the solidified object will attach and will not displace when guide 13 is slid off.

A suitable drive 16 is an XYZ-positioning stage or, for automated fabrication, an XYZ-positioning table with motors, motion controllers (all, for example, from Daedal Inc. of Harrison City, PA) and computer. Container 10 or substrate 12 can also be provided with own drives to take over some positioning from drive 16, to expedite fabrication for irradiation sequences requiring large displacements, e.g. Rotary motion can be used in addition or instead of linear motion.

Radiation guide 13 that irradiates upwards as shown in FIG. 2 or in any other direction can be used. Also, drive 16 that rotates guide 13 (or its irradiating tip), and thus modulates the space angle of irradiation emitting surface 15, can be employed, in particular, to increase fabrication accuracy of curved and inclined walls. Several guides 13, of same or different sizes and space angles of radiation emitting surface 15, can be used to irradiate different areas or to simultaneously irradiate same area from different sides. The latter is useful, for example, in making of thin walls and shells.

Figures 3, 4:
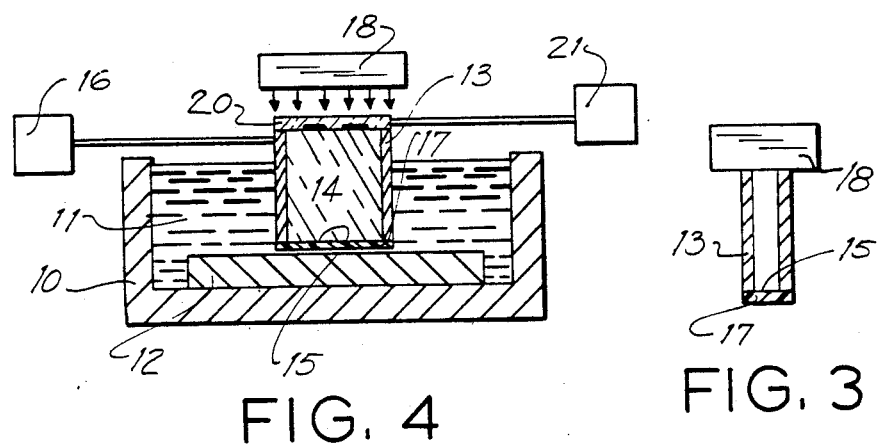
FIG. 3 is a view of another preferred embodiment of the invention (container and drive not shown)
FIG. 4 is a view of an embodiment of the invention with a fiberoptic faceplate and a mask.

Guide 13 can be a hollow tube sealed with a relatively rigid layer 17 as shown in FIG. 3; a laser or other radiation source 18 is attached to guide 13. Radiation source 18 can also be mounted separately and connected to guide 13 with radiation-guiding optics, or, dimensions permitting, be mounted inside guide 13 over layer 17.

Instead of employing layer 17 that preserves cross-linking capability of irradiated photopolymer, guide 13 (or its irradiating tip) can be made of a material containing copper, oxygen or other ingredients that inhibit photopolymer cross-linking.

In another embodiment, shown on FIG. 4 and useful, in particular, for faster fabrication, radiation emitting surface 15 is of large size, up to full object 19 cross-section, and emits different amounts of radiation from different points so that desired configurations of desired cross-sectional size are solidified during each irradiation step. Optical fibers 14 are alligned and fused together (faceplate) and a changeable mask or aperture 20 that has areas of different opacities and thus modulates the irradiation of fibers 14, is added. For automatic fabrication, drive 21 can be used that changes masks/apertures in desired sequence. Instead of a mask, an array of miniature individually controlled mirrors or shutters like Texas Instruments' chip incorporating a million mirrors can be employed to modulate irradiation of individual fibers of the faceplate 14. Mask 20 with radiation source 18 can be substituted with a modulating radiation source that can provide different amounts of radiation to different fibers, such as a scanning radiation source that scans individual fibers of faceplate 14, or an array radiation source 18 that includes a number of individually controlled radiation sources (similar to LED displays) one per fiber or per cluster of fibers.

Figure 5:
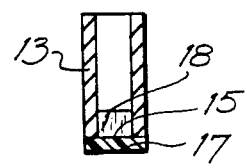
FIG. 5 is a view of an embodiment of radiation guide with a modulating radiation source mounted inside the guide.

FIG. 5 shows an embodiment of guide 13 with a modulating radiation source 18 that fits inside radiation guide 13 and is mounted preferrably adjacent to layer 17. No fiberoptic faceplate is employed. Layer 17 can be provided with a radiation transmittent plate of glass or other suitable material for rigidity.

While only several preferred embodiments have been shown and described herein, the invention is not intended to be limited thereby but only by the scope of the claims which follow.

I claim:

1. In a method of preparing three-dimensional objects from an uncured photopolymer by treating the photopolymer with radiation to solidify the polymer, the improvement which comprises irradiating said uncured photopolymer by emitting radiation directly into desired areas within a quanity of said uncured photopolymer.

2. A method of preparing three-dimensional objects which comprises:
   (a) providing a quantity of uncured photopolymer,
   (b) positioning a radiation-emitting surface within a quanity of uncured photopolymer in contact with area of said photopolymer to be irradiated,
   (c) emitting photopolymer solidifying radiation from said radiation emitting surface in an amount effective to cause photopolymer to solidify to the desired extent.

3. The method of claim 2 in which said radiation emitting surface has a transparent coating, said transparent coating being of material which does not interfere with the subsequent cross-linking of the photopolymer.

4. The method of claim 3 is which said material is fluorinated ethylene propylene.

5. The method of claim 3 in which said material is UHMW polyolefin.

6. The method of claim 2 in which steps (b) and (c) are repeated desired number of times.

7. The method of claim 2 which additionally includes inhibitting cross-linking of photopolymer in contact with said radiation emitting surface.

8. An apparatus for producing of three-dimensional objects from photopolymer, said apparatus comprising:
   (a) a container for an uncured photopolymer,
   (b) a radiation emitting surface adapted to come into contact with desired area within the photopolymer which is inside said container; and
   (c) a source of photopolymer solidifying radiation adapted to transmit an effective amount of radiation through said radiation emitting surface into said desired area inside the photopolymer so that at least a portion of said desired area inside photopolymer will solidify.

9. An apparatus of claim 8 which additionally includes means for preserving further cross-linking capability of photopolymer layer adjacent to said radiation emitting surface.

10. An apparatus of claim 8 in which said radiation emitting surface is of material that preserves cross-linking capapability of photopolymer surface adjacent to said radiation emitting surface.

11. An apparatus of claim 10 in which said material is fluorinated ethylene propylene.

12. An apparatus of claim 10 in which said material is UHMW polyolefin.

13. An apparatus of claim 8 which additionally includes a mask to modulate irradiation of said photopolymer.

14. An apparatus of claim 8 which additionally includes optical fibers to transmit radiation from said source of radiation to said radiation emitting surface.

15. An apparatus of claim 9 in which said means include a material inhibiting cross-linking of said photopolymer.

16. An apparatus of claim 8 which includes means for providing desired mutual space orientation of said radiation emitting surface and said photopolymer.

17. An apparatus of claim 8 which includes an additional radiation emitting surface.

18. An apparatus of claim 8 in which said source of photopolymer solidifying radiation is a source that is capable of providing varying amounts of radiation across said radiation emitting surface.

* * * * *